Dec. 31, 1963 O. R. SHAVER ETAL 3,115,697

METHOD OF MAKING A LOW RESISTANCE OHMIC CONTACT

Filed Aug. 31, 1960

MINDAUGAS E. GEDGAUDAS,
OLIVER ROY SHAVER,

INVENTORS.

BY Spensley and Horn

ATTORNEYS.

United States Patent Office 3,115,697

Patented Dec. 31, 1963

3,115,697

METHOD OF MAKING A LOW RESISTANCE OHMIC CONTACT

Oliver Roy Shaver, Houston, Tex., and Mindaugas E. Gedgaudas, Santa Monica, Calif., assignors to Pacific Semiconductors Incorporated, a corporation of Delaware Filed Aug. 31, 1960, Ser. No. 53,085
1 Claim. (Cl. 29—155.5)

This invention relates to semiconductor devices and more particularly to a device including an improved broad area contact and to a method for providing the same.

It has long been desirable for many types of semiconductor devices to provide a low resistance broad area ohmic contact to the surface of the crystal body constituting the device. It has also been found important to provide a contact of the character described which is resistant to etchants typically used in the semiconductor industry. A typical etch includes a combination of nitric acid, acetic acid and hydrofluoric acid.

A material which has been found to be inherently capable of producing a low resistance contact is gold. Additionally, other metals such as silver and platinum are also quite satisfactory.

It has further been known to dope the lead wire element with an impurity of the same conductivity type as the region of the semiconductor crystal body to which contact is to be made.

The present invention provides a new and improved means for introducing the impurity into the lead element which results in a uniform and controlled doping level and hence a contact of better and more reliable characteristics.

The present invention method is particularly suited for producing doped gold plated leads for use in connection with micro-miniature devices which are a recent development in the semiconductor art. One such micro-miniature device is produced by the company assignee of the present invention. An example of such a device is a diffused junction silicon diode. This invention will be described in connection with such a device. The diode includes a P-N junction diffused silicon crystal body. To opposite surfaces of the crystal there is ohmically bonded first and second lead wires which are ribbon shaped. The ribbon leads are of a width approximately equal to that of the crystal die and are directly bonded to substantially the entire surface thereof. The portions of the device proximate the crystal die, in addition to being treated to produce a passive surface, are coated with a hermitically sealing, chemically inert, material. No fluxes or solders are used in providing the contact-bond between the lead ribbons and the surface of the crystal die as is often used in accordance with prior art practices.

The omission of such materials minimizes contamination of the surface, especially in the area of the P-N junction, thus materially improving the reliability of the completed device.

In addition there results an increase in the permissible operating storage temperature limits.

The present invention permits the elimination of such materials while providing a contact of improved reliability combined with extremely low resistance.

It is therefore an object of the present invention to provide an improved broad area low resistance contact to the surface of a semiconductor crystal body excluding the use of fluxes, solders, or the like.

Another object of the present invention is to provide an improved low resistance contact to the surface of a semiconductor crystal body of a predetermined conductivity type.

Yet another object of the present invention is to provide an improved method for producing a low resistance broad area contact between the surface of a semiconductor crystal body and a metal lead element.

A still further object of the present invention is to provide an improved method for depositing an active impurity upon the surface of a plated lead element for a semiconductor crystal device.

Yet a further object of the present invention is to provide a method for producing uniformly doped gold plated lead wire to be used to make ohmic contact with the surface of a semiconductor crystal body of the same conductivity type as that of the dopant.

A still further object of the present invention is to provide an improved method for depositing a layer of uniform thickness of an active impurity upon the surface of a thin ribbon shaped metallic lead element for bonding to the surface of a semiconductor crystal body.

In accordance with the presently preferred method of the present invention, a plurality of gold plated nickel, ribbon shaped lead elements are disposed within an aqueous solution including about 1% by weight of $As_2O_5$. The solution is heated for approximately 10 minutes to approximately the boiling point. Thereafter the lead elements are removed and permited to dry. This results in the deposition of a uniform coating including arsenic which is an N-type conductivity determining active impurity.

The novel features which are believed to be characteristic of the invention, both as to its organization and method of operation, together with further objects and advantages thereof will be better understood from the following description considered in connection with the accompanying drawing in which the invention is illustrated by way of example. It is to be expressly understood, however, that the drawing is for the purpose of illustration and description only, and is not intended as a definition of the limits of the invention.

This invention will be described with reference to the production of a specific device, namely, a miniature semiconductor diode, for purposes of simplicity and clarity of explanation only. It will be appreciated that it is equally applicable to the production of any other semiconductor device employing metallic lead elements bonded to the surface of a crystal body where it is desired to produce a low resistance ohmic contact and is also equally applicable to any metal utilized in the art for lead elements.

Figure 1:
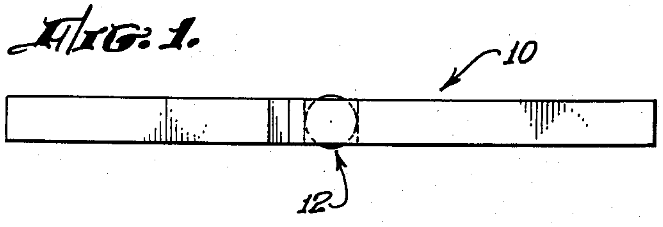
FIGURE 1 is a plan view of a miniaturized semiconductor diode during an intermediate stage of production, which employs at least one lead element which has been treated in accordance with the present invention.
Figure 2:
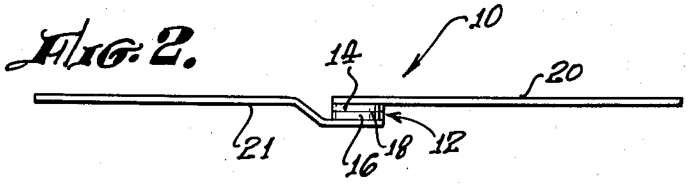
FIGURE 2 is a front elevation of the diode of FIGURE 1.
Figure 3:
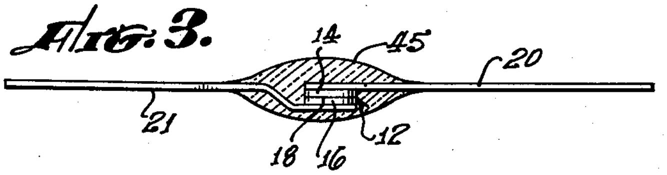
FIGURE 3 is a front elevation of the completed diode of FIGURES 1 and 2.
Figure 4:
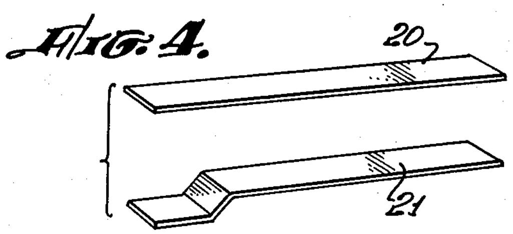
FIGURE 4 is a perspective partial assembly view of the lead elements bonded to the crystal body of the diode in FIGURES 1–3.

Referring now to the drawing there is shown in FIGURES 1 and 2, a miniaturized semiconductor diode generally designated by the numeral 10. In this embodiment a silicon crystal body 12 forms the heart of the device. The body 12 includes a P-type conductivity region 14 and an N-type conductivity region 16 separated by a P-N junction 18. The P-N junction may be produced by any method known to the art, such as diffusion, for example.

In the illustrative device shown, leads 20 and 21 are ohmically bonded to opposite surfaces of the crystal 12 such that one lead 20 is in ohmic contact with the P-type conductivity region 14 while the other lead 21 is in contact with the N-type conductivity region 16. The leads 20 and 21 are ribbon shaped, i.e., the cross-sectional configuration is rectangular.

In producing the body 12, the initial conductivity of the parent crystal is N-type. The P-type region 14 is established by diffusion of boron into the parent crystal, as from a source of $B_2O_3$ in an open tube. Thus, a P-type region results in the two outer faces of the parent crystal. One of these regions is removed by lapping to again expose the N-type conductivity central region of the parent crystal. Next follows a chemical etch in order to present a clean surface prior to the lead bonding.

The lead to be bonded to the N-type region 16 of the crystal is now prepared in accordance with the present invention. A plurality of these ribbon shaped lead elements 21, typically 500 in number, are immersed in a solution hereinafter to be described. These lead elements are preferably gold plated nickel ribbons. Alternatively, gold plated Kovar ribbon elements may be used. The invention is not intended, however, to be limited to nickel or Kovar for the basic material. Other metals which have a relatively low thermal coefficient of the expansion (one which approaches that of silicon) may be used. Examples of such materials are molybdenum and tungsten.

Figure 5:
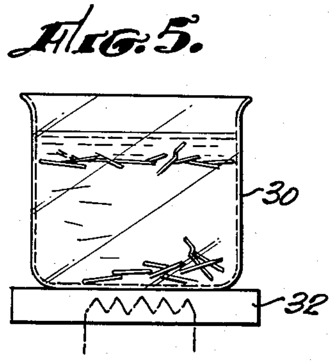
FIGURE 5 is a front elevation showing a plurality of lead elements as shown in FIGURE 4 being processed in accordance with the present invention.

The solution into which the lead elements are to be immersed is preferably prepared as follows: To approximately 75 ml. of $H_2O$ there is added an amount of $As_2O_5$ in order to establish a solution which has a concentration of 0.05% to 5% and preferably 0.1% to 1% of $As_2O_5$ by weight. The beaker 30 (see FIGURE 5) containing the solution is placed upon a hot plate 32 which is maintained at from 200° C. to 300° C. in order to bring the solution to a boil. While it has been found preferable to boil the solution, this is not a necessary requirement of the present invention. With the solution heated to around its boiling point the approximately 500 lead elements 21 are placed therein. The addition of these elements to the boiling solution will reduce the temperature of the solution to below its boiling point for a short time until equilibrium is again reached. The elements are left in the solution for a time sufficient to deposit a sufficient amount of arsenic in order to readily act as an N-type dopant. At the concentration above mentioned 10 minutes has been found to be a satisfactory time of immersion.

After this 10 minute boiling step the beaker or container 30 is removed from the heat source 32 and the lead elements are removed therefrom. They are placed upon clean filter paper and then dried. It has been found preferable to accomplish this step by placing the lead elements under a heat lamp for approximately two hours. The lead elements are now ready for bonding to the exposed N-type surface 16 as there is now a sufficient surface deposition of dopant on the lead surface in a form which makes it readily mateable upon subsequent lead bonding. The lead bonding is by any suitable fusion process wherein heat and/or pressure are used, such as thermo-compression bonding and alloy bonding, for example.

The hereinabove described process by which arsenic, an N-type conductivity active impurity, is deposited upon the gold plated lead elements serves to greatly improve the bond produced between the lead element and the N-type surface. It has not been found necessary in producing the above described miniature diode, to similarly deposit a P-type impurity upon the lead element 20 which is bonded to the P-type region 14, as the surface of the P-type region to which contact is made already includes a high concentration of P-type impurity, in this example, boron, as a result of a diffusion operation by which this P-type region was produced.

After the two lead elements 20 and 21 are bonded to the body 12 the body is again etched in accordance with the well known practices and further surface treatments, not forming part of this invention are employed. This results in the formation of a coating 45 about the crystal body 12 effecting an hermetic seal about the crystal extending a distance outwardly over the lead elements.

Thus, the essence of the present invention involves the discovery that an improved low resistance ohmic contact may be produced by bonding a broad area lead element to a silicon semiconductor body, that portion of the lead element contacting the silicon body having been doped by a particular method before bonding to the silicon body. The method involves contacting that particular portion of the lead element with a compound including a conductivity type determining impurity in solution. For producing a contact to an N-type region of a silicon body, compounds which include either arsenic, antimony, phosphorous or bismuth or any combination thereof may be used. It is found especially satisfactory to include oxides of such compounds which are soluble in water. Such compounds include arsenic trioxide, arsenic pentoxide, antimony trioxide, and the like. Similarly, compounds of P-type active impurities which in solution will release such impurities may also be used. While it is pointed out in the present application, for purposes of producing contacts to opposite surfaces of the particular diode described, it is not necessary to provide doping for the P-type lead element since the P-type region is itself heavily doped. This may not necessarily be the case. For example, the N-type region may be heavily doped and the P-type region require a doped lead element to produce a low resistance ohmic contact. In such cases, gallium trioxide or indium trioxide or boron trioxide may be advantageously employed. Other compounds may be used which contain more than one active impurity therein. Further, two or more compounds, including more than one active impurity may be used. While other compounds have been indicated as being within the spirit of the present invention, the two compounds which have been found to be particularly useful are arsenic trioxide and arsenic pentoxide, both of which are soluble in water. These compounds, of course, release arsenic in solution.

While the present invention method has been described with respect to producing a coating of active impurity upon the surface of a gold plated lead element it is equally applicable to the deposition of an active impurity upon different lead element surfaces such as silver, platinum or the like. In addition, it has been described with respect to production of such a coating on a plated lead element which is primarily made of nickel or a nickel alloy such as Kovar, it may be applied on a lead element which is made of pure metal such as gold, silver or platinum.

There has thus been described a new and improved method for producing a low resistance broad area ohmic contact to a surface of a silicon semiconductor body.

What is claimed is:

The method of forming a low resistance ohmic contact between a metallic lead element and an N-type conductivity surface region of a silicon semiconductor body, said method including the steps of: immersing said element in an aqueous solution including arsenic pentoxide in the amount of 0.1 to 1% by weight; heating said solution to near its boiling point; removing said element from said solution; drying said element; and fusing said element to said surface region of said semiconductor body.

References Cited in the file of this patent

UNITED STATES PATENTS

| | | |
|---|---|---|
| 2,828,232 | Myer | Mar. 25, 1958 |
| 2,915,417 | Potvin et al. | Dec. 1, 1959 |
| 2,948,836 | Freedman | Aug. 9, 1960 |
| 2,957,112 | Sils | Oct. 18, 1960 |
| 3,006,167 | Anderson et al. | Oct. 31, 1961 |

FOREIGN PATENTS

| | | |
|---|---|---|
| 843,156 | Great Britain | Apr. 13, 1938 |